United States Patent [19]

van Halteren

[11] Patent Number: 4,567,382

[45] Date of Patent: Jan. 28, 1986

[54] ELECTRET TRANSDUCER AND A METHOD FOR MANUFACTURING AN ASSEMBLY OF BACKPLATE, ELECTRET FOIL AND DIAPHRAGM PLATE

[75] Inventor: Aart Z. van Halteren, Zwaag, Netherlands

[73] Assignee: Microtel B.V., Amsterdam, Netherlands

[21] Appl. No.: 598,682

[22] Filed: Apr. 10, 1984

[51] Int. Cl.[4] .................. G11C 13/02

[52] U.S. Cl. .................. 307/400; 179/111 E; 29/592 E

[58] Field of Search .................. 307/400; 179/111 E; 29/592 E, 594; 301/225

[56] References Cited

U.S. PATENT DOCUMENTS 3,772,133 11/1973 Schmitt .................. 307/400 X 4,070,741 1/1978 Djuric .................. 179/111 E X 4,160,881 7/1979 Smulders .................. 179/111 E 4,250,415 2/1981 Lewiner et al. .................. 307/400

4,356,049 10/1982 Tamura et al. .................. 179/111 E X

*Primary Examiner*—A. D. Pellinen

*Assistant Examiner*—Derek S. Jennings

*Attorney, Agent, or Firm*—Brady, O'Boyle & Gates

[57] ABSTRACT

An electret transducer and a method for making same. A multiple support between a diaphragm plate and a backplate is provided by a plurality of relatively small spacing disks made of an electrically insulating material and which as separate posts are fixedly attached on the upper surface of the backplate. Such spacing disks are conveniently and accurately punched from a foil of dielectric material which is held opposite and above the backplate, whereafter the spacing disks thus formed are attached on the backplate.

8 Claims, 4 Drawing Figures

ELECTRET TRANSDUCER AND A METHOD FOR MANUFACTURING AN ASSEMBLY OF BACKPLATE, ELECTRET FOIL AND DIAPHRAGM PLATE

BACKGROUND OF THE INVENTION

1. Field of the Invention

The invention relates to an electret transducer comprising a diaphragm plate and a backplate with spacing means between the diaphragm plate and the backplate for providing multiple supports between the diaphragm and backplate, and a method for manufacturing a backplate, electret, and diaphragm plate assembly.

2. Prior Art

An electret transducer of the above kind is known from U.S. Pat. No. 4,160,881 issued July 10, 1979 and entitled "Improved motor assembly for an electret transducer and a method for manufacturing such a motor assembly."

According to this prior art the multiple support between the diaphragm plate and the backplate is provided by means of a meshlike screen disposed on the electret foil covering the upper backplate surface. Around its circumference such screen is fixedly attached to a mounting rim supporting the backplate and diaphragm plate.

Although in principle the operational characteristics such as for instance transducing efficiency of such transducer can be improved and controlled with such a prior art transducer structure, in practice the yield obtained when such transducers are manufactured in a mass production process is less than could be expected. Moreover the sensitivity of such transducers is deleteriously reduced due to the fact that spacing screen is fixedly attached to the supporting mounting rim. Unsurmountable manufacturing problems arise when it is attempted to improve the sensitivity by specific selection of design parameters. Moreover this approach fails to lead to a mass production process whereby a high yield is ensured for electret transducers which should meet stringent specifications.

U.S. Pat. No. 3,740,496, issued June 19, 1973 and entitled "A diaphragm assembly for an electret transducer", also discloses an electret transducer of the above kind. According to this prior art multiple support between the diaphragm plate and the backplate is provided by means of diaphragm supporting members which are formed integrally with the backplate. More in particular the supporting members are upwardly extending indentations formed in the backplate and are therefore formed from the backplate itself. This prior art structure is liable to the same deficiencies as has been outlined above. Moreover this prior art structure is unappropriate for manufacturing transducers having accurately reproduceable characteristics such as sensitivity and frequency response.

U.S. Pat. No. 4,070,741 teaches a method of making an electret transducer, wherein posts for supporting the condenser transducer diaphragm in relation to a backplate are formed on the diaphragm film itself by selectively etching away a photoresist material laminated on the film. The electret material is then supported on the backplate rather than carried by the diaphragm. Apart from being relatively complicated and uneconomical, this prior art method leads to a relatively high parasitic capacitance thereby degrading the transducer performance; moreover it requires the height of the backing plate of being adjusted with respect to diaphragm mounting rings so that the posts lift and slightly distort resp. the diagram. This prior art is inappropriate for providing a mass production process ensuring a high yield of electret transducers which should meet stringent requirements within close tolerances.

SUMMARY OF THE INVENTION

It is an object of the subject invention to provide an improved electret transducer which by its structure appropriately overcomes the above described deficiencies. More in particular it is an object of the invention to provide an improved backplate assembly for such an electret transducer which backplate assembly provides improved multiple support between diaphragm and backplate thereby broadening the selection range for the design parameters.

The subject invention substantially relies on the idea to strongly reduce the local capacities between the diaphragm plate and the backplate at the locations where this diaphragm is supported thereon. By providing a structure enabling the designer to strongly reduce such local capacitance the sensitivity of the transducer is highly improved while also the signal-noise ratio is improved because the internal impedance of the transducer cartridge is increased thereby.

As an essential feature of an electret transducer of the subject invention the multiple support between diaphragm plate and backplate is provided by a plurality of relatively small spacing disks made of an electrically insulating material and which as separate posts are fixedly attached on the upper surface of the backplate. With such a structure the above local capacitance is substantially determined by the supporting surface area contacting the diaphragm plate, the height and the relative dielectrical constant of the material from which the spacing disk or spacing support post has been made.

With a multiple support between diaphragm and backplate as proposed by the subject invention the distance $\delta$ between effective diaphragm surface areas and backplate can be substantially reduced without increasing the aforementioned local capacitance to an intolerable extent. In other words by decreasing the afore-mentioned distance $\delta$ the sensitivity of the electret transducer is improved without an intolerable increase of the local capacitance.

According to a further aspect of the subject invention spacing disks or support posts of the above kind can be appropriately manufactured in a mass production process within very close tolerances. Further it is feasible to manufacture said spacing disks with relatively small supporting surface areas contacting the diaphragm thereby further reducing the local capacitance.

BRIEF DESCRIPTION OF THE DRAWINGS

The foregoing and other objects, features and advantages of the subject invention will be apparent from the following more in particular description of the preferred embodiments of the invention, as illustrated in the accompanying drawings wherein.

DETAILED DESCRIPTION OF THE INVENTION

Figure 1:
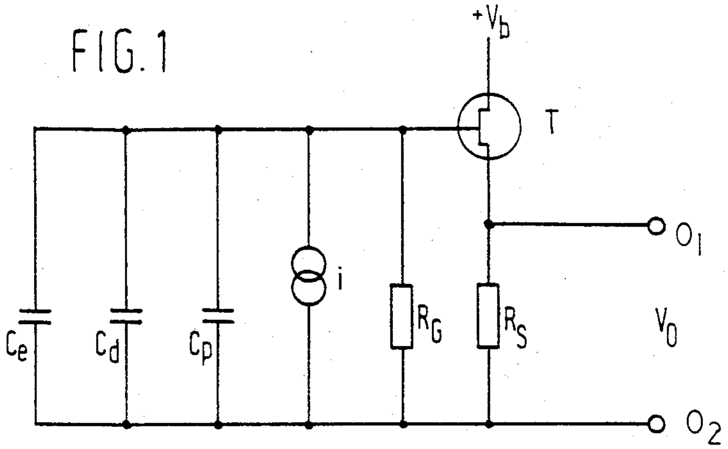
FIG. 1 is an electric circuit diagram for illustrating the operation of an electret transducer.

The electric circuit diagram shown in FIG. 1 is illustrative of the major electrical capacitances determinative of an electret transducer, in combination with an auxiliary amplifier for amplifying the electrical signal from the electret transducer. As illustrated in FIG. 1 an electret transducer includes following major capacitances: $C_e$, i.e. the effective capacitance varying in response to applied sound waves and providing the effective transducer output signal (in FIG. 1 schematically indicative by signal source i); $C_d$, i.e. the local capacity between diaphragm plate and backplate at the locations where the former is supported from the backplate; and $C_p$, i.e. other parasitic capacitances of the electret transducer. The afore-mentioned output signal i is supplied to an amplifier which is shown as a source follower comprising in this embodiment a field effect transistor T having a resistor $R_s$ included in its source-circuit and a gate resistor $R_G$ connected in its gate-earth circuit. The amplified output signal $V_o$ is delivered between output terminals $O_1$ and $O_2$.

Now the sensitivity or transducing efficiency of such an electret transducer is proportional to the ratio between $C_e$ and the sum of the capacitances $C_e+C_d+C_p$. Now in accordance with the subject invention the capacitance $C_d$ is strongly reduced by employing a multiple support between diaphragm and backplate provided by a plurality of relatively small spacing disks each being made of an electrically insulating material.

Figure 2:
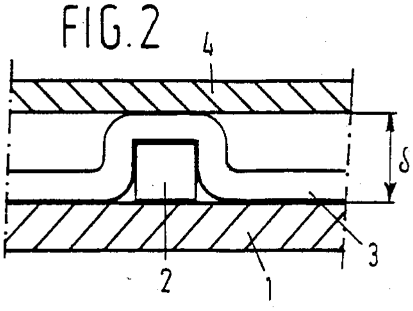
FIG. 2 is a relatively enlarged view in cross-section showing a fractional part of a backplate-diaphragm assembly of the subject invention.
Figure 3:
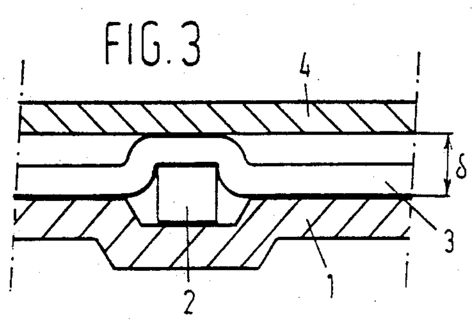
FIG. 3 is a relatively enlarged view in cross-section showing a fractional part of another embodiment of the inventive backplate-diaphragm construction.

A fractional part of the inventive assembly including backplate, spacing element, electret foil and diaphragm plate is shown in cross-section view in FIG. 2. In FIG. 2 the following components have been illustrated a backplate 1; a spacing element 2 of the subject invention and which has been fixedly attached on the upper surface of the backplate; an electret foil 3; and a diaphragm plate 4. In the embodiment shown in FIG. 2 the spacing element 2 is made of a dielectric material such as polyimide, commonly available under the trademark "KAPTON", with at its side opposite to the backplate, has been provided with a thin layer of polytetrafluoroethylene commonly available under the trademark "TEFLON". With the "TEFLON" layer the spacing element 2 is fixedly attached on the backplate. On the backplate and the spacing elements mounted thereon an electret foil 3 has been disposed in a manner as schematically indicated in FIG. 2. A diaphragm plate 4 is supported on the protrusions formed by the respective spacing elements 2 and the respective electret foil portion disposed thereon. With such a structure the afore-mentioned distance $\delta$ can be conveniently reduced without deleteriously increasing the local capacitance $C_d$ which is substantially determined by the amount of dielectric material between diaphragm 4 and backplate 1 at the location where the respective spacing element 2 has been mounted thereon. For instance by reducing the thickness of the electret foil, the distance $\delta$ can be reduced while notwithstanding the local capacitance $C_d$ is not substantially increased. Also by decreasing the cross-sectional area of the spacing elements 2 a further reduction of the local capacitance $C_d$ is obtained. FIG. 3 shows an alternative embodiment for mounting the spacing elements on the backplate. In the embodiment as shown in FIG. 3 similar components are provided with the same reference symbols as used in FIG. 2. In the embodiment of FIG. 3 the spacing elements 2 are mounted in downwardly extending indentations made in the backplate 1. With this embodiment the distance $\delta$ can be further reduced without intolerably increasing the local capacitance $C_d$.

In an electret transducer of the subject invention use has been made of a diaphragm plate which is made from for instance polyethylene terephthalate, commonly available under the trademark MYLAR, or any similar material, on both sides of which an electrically conductive coating has been provided. By employing a HF heating process a foil can be formed in the desired shape so that a diagram plate having a slight roll or corrugation along its periphery is obtained. By suitably selecting the heating temperature maximum stability can be obtained with a minimum heating load of the central foil portion.

According to a further aspect of the subject invention an electret transducer can be manufactured with a high degree of reproduceability and wherein stringent requirements are met. This because the spacing elements can be accurately mounted on predetermined positions on the backplate while the dimension $\delta$ also is accurately determined thereby. A method for mounting and fixedly attaching spacing elements on the backplate comprises the following steps: The backplate is accurately positioned relative a plate shaped punching die. A foil of an electrically insulating dielectric material, thereafter is disposed on this plate shaped punching die which has perforations formed therein. The pattern of the perforations corresponds to the pattern of spacing elements to be mounted on the backplate. In a preferred embodiment, said foil comprises a first layer of polyimide, commonly available under the trademark of "KAPTON" and a second thin layer of polytetrafluoroethylene, commonly available under the trademark "TEFLON". This foil is disposed in such a manner on the plate shaped punching die that the above-mentioned second layer of "TEFLON" is turned towards the backplate which has been positioned below the punching die. With the backplate held at an accurately defined position in relation to said punching die under the lower surface thereof, a punching tool now is caused to penetrate said foil and to enter the corresponding perforations in said punching die, thereby forming spacing disks or spacing elements, from said foil, while disposing same on said backplate. For fixedly attaching said spacing elements on said backplate the temperature thereof is held at an elevated value such that the second "TEFLON" layer fuses to the upper surface of the backplate. After cooling of the assembly backplate and spacing elements mounted thereon, a unitary component is obtained wherein the spacing elements are accurately positioned on the backplate upper surface while having the desired height dimension which accurately determines the afore-mentioned distance $\delta$.

Following the above process the assembly thus obtained can be provided with a layer of an electret foil. An electret foil is disposed on the backplate-spacing element assembly, with a certain mechanical tension whereby also the backplate assembly is held at a desired position. Thereafter the backplate assembly is heated to a temperature which is lower than the fusing temperature of the electret foil material. In this situation pressurized heated air is supplied to the upper foil surface side thereby causing the foil material to slowly flow and fittingly cover the backplate surface and the spacing elements protruding therefrom, until cohesion of the foil material along the periphery of said backplate and the upper surfaces of said spacing elements is disrupted. After cooling the assembly comprising said backplate, said spacing elements and said electret foil disposed thereon, the diaphragm plate preformed in a manner as has been described in the foregoing is disposed on the protruding spacing elements.

Figure 4:
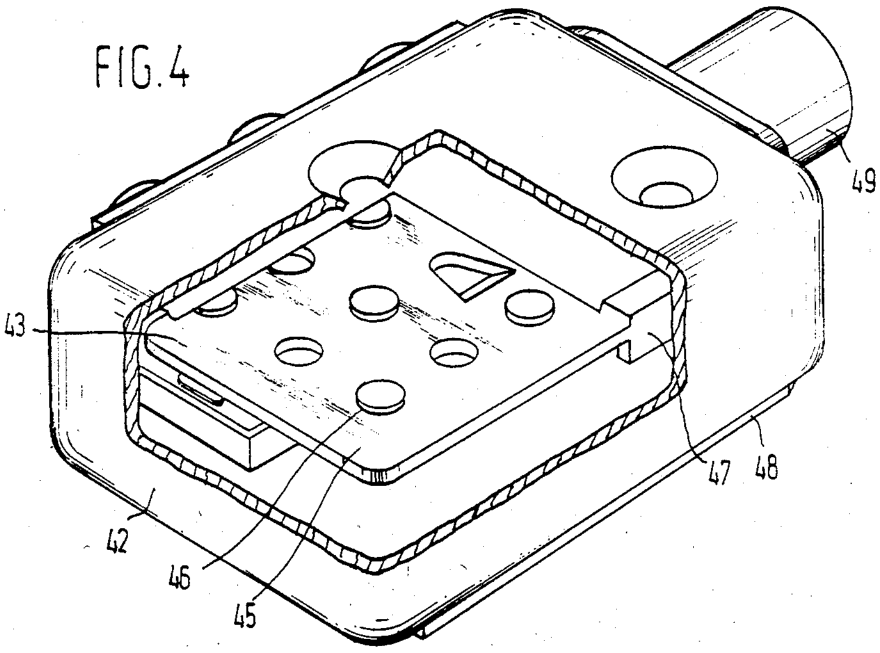
FIG. 4 shows an embodiment of an electret transducer illustrative of the subject invention.

FIG. 4 is illustrative of an electret transducer cartridge wherein the subject invention has been incorporated. The transducer shown in FIG. 4 comprises a casing (42) which in the shown embodiment has a substantially rectangular shape. The casing is provided with a cover (48) and a sound outlet gate (49). In alternative embodiments more than one of these gates can be provided both on the casing (42) and on the cover (48). The motor assembly of this electret transducer comprises a plate shaped diaphragm (47), for instance made from polyethylene terephthalate commonly available under the trademark "MYLAR" or of any similar material, which on both sides is provided with an electrically conductive coating; along the periphery of this diaphragm plate there has been formed a compliant corrugation; a backplate (45) which on the surface opposite to the diaphragm plate is provided with an electret foil (43) and a plurality of spacing elements (46) which are determinative of the distance $\delta$ between the diaphragm plate (47) and the backplate (45).

The diaphragm together with the backplate is fixedly bonded to the sidewall of the casing (e.g. by an appropriate adhesive), in such a manner that a first closed space is formed which through coupling bores in the backplate, is acoustically connected to a second acoustical space which is defined between the backplate and the diaphragm. A third acoustical space is defined between the diaphragm and the casing. Said third space through the gate (49) is acoustically coupled to the exterior space.

I claim:

1. An electret transducer comprising in combination: a casing and a motor assembly, said motor assembly comprising a diaphragm plate having a compliant surround at its periphery, a backplate, a plurality of apertures provided in said backplate, an electret foil disposed on said backplate, a plurality of spacing disks each being formed of an electrically isolating material and fixedly attached on the backplate respectively, said diaphragm plate through the intermediary of an electret foil portion being supported by said spacing disks.

2. An electret transducer according to claim 1, wherein each one of said spacing disks at their ends opposite to their ends supporting said diaphragm plate, are fixedly attached to said electret foil.

3. An electret transducer comprising in combination a casing and a motor assembly, said motor assembly comprising a diaphragm plate having a compliant surround at its periphery, a backplate, a plurality of apertures provided in said backplate, an electret foil disposed on said backplate, a plurality of substantially cylindrically shaped spacing disks each being formed of an electrically isolating material and fixedly attached on said backplate respectively, said diaphragm plate through the intermediary of an electret foil portion being supported by said spacing disks.

4. An electret transducer according to claim 3, wherein each one of said substantially cylindrically shaped spacing disks at their ends opposite to their ends supporting said diaphragm plate, are fixedly attached to said electret foil.

5. An electret transducer comprising in combination: a casing and a motor assembly, said motor assembly comprising a diaphragm plate having a compliant surround at its periphery, a backplate, a plurality of apertures provided on said backplate, an electret foil disposed on said backplate, a plurality of substantially cylindrically shaped spacing disks, each being made of polyimide, and fixedly attached on said backplate respectively, said diaphragm plate through the intermediary of an electret foil portion being supported by said spacing disks.

6. An electret transducer comprising in combination: a casing and a motor assembly, said motor assembly commprising a diaphragm plate having a compliant surround at its periphery, an apertured backplate having a plurality of downwardly extending indentations formed therein, an electret foil disposed on said backplate, a plurality of spacing disks, each being formed of an electrically isolating material and fixedly attached within a corresponding one of said indentations, said diaphragm plate through the intermediary of an electret foil portion being supported by said spacing disks.

7. A method for making a diaphragm-backplate assembly for an electret transducer, comprising the following steps of: disposing a foil of an electrically isolating dielectric material and having an accurately defined thickness on a plate shaped punching die having perforations formed therein, bringing and holding respectively a backplate at an accurately defined position in relation to said die under the lower surface thereof, causing a punching tool to penetrate said foil and to enter the corresponding perforations in said die, thereby forming spacing disks from said foil, said disposing same on said backplate, securing said spacing disks on said backplate, disposing an electret foil on said backplate and said spacing disks, maintaining the temperature of said backplate at an elevated value below the fusing temperature of said foil, supplying pressurized, heated air to the upper foil surface side, thereby causing the foil material to slowly flow and fittingly cover the backplate surface and the spacing disks protruding therefrom, until cohesion of the foil material along the periphery of said backplate and the upper surfaces of said disks is disrupted, cooling the assembly comprising said backplate, said spacing disks and said electret foil disposed thereon, disposing a preformed diaphragm plate on the protruding spacing disks.

8. A method according to claim 7, comprising the steps of:

disposing a foil comprising a first layer of polyimide and a second layer of polytetrafluoroethylene, with said second layer disposed on said plate shaped punching die, and heating said backplate to a temperature at which the material of said second layer is caused to fuse, thereby securing said spacing disks formed from said foil on the backplate surface.

* * * * *